(12) United States Patent
Moghe et al.

(10) Patent No.: US 9,257,834 B1
(45) Date of Patent: Feb. 9, 2016

(54) SINGLE-LAMINATE GALVANIC ISOLATOR ASSEMBLIES

(71) Applicant: THE SILANNA GROUP PTY LTD., Eight Mile Plains, Queensland (AU)

(72) Inventors: Yashodhan Moghe, Marsfield (AU); Virgilio T. Baterina, San Diego, CA (US); Stuart Molin, Carlsbad, CA (US)

(73) Assignee: The Silanna Group Pty Ltd., Eight Mile Plains (AU)

( * ) Notice: Subject to any disclaimer, the term of this patent is extended or adjusted under 35 U.S.C. 154(b) by 0 days.

(21) Appl. No.: 14/621,752

(22) Filed: Feb. 13, 2015

(51) Int. Cl.
*H03H 7/24* (2006.01)
*H02H 7/20* (2006.01)
*H05K 7/02* (2006.01)

(52) U.S. Cl.
CPC . *H02H 7/205* (2013.01); *H05K 7/02* (2013.01)

(58) Field of Classification Search
CPC .................................. H02H 7/205; H05K 7/02
USPC ........................................................ 333/24 C
See application file for complete search history.

(56) References Cited

U.S. PATENT DOCUMENTS

| | | | |
|---|---|---|---|
| 4,780,795 A | 10/1988 | Meinel | |
| 5,049,527 A | 9/1991 | Merrick et al. | |
| 5,589,709 A | 12/1996 | Dobkin et al. | |
| 5,945,728 A | 8/1999 | Dobkin et al. | |
| 5,952,849 A | 9/1999 | Haigh | |
| 6,417,743 B1 | 7/2002 | Mihailovich et al. | |
| 6,864,509 B2 | 3/2005 | Worley | |
| 7,016,490 B2 | 3/2006 | Beutler et al. | |
| 7,262,974 B2* | 8/2007 | Yang et al. | 361/780 |
| 7,335,972 B2 | 2/2008 | Chanchani | |
| 7,423,503 B2 | 9/2008 | Larson et al. | |
| 8,143,082 B2 | 3/2012 | Dungan et al. | |
| 8,169,108 B2 | 5/2012 | Dupuis et al. | |
| 8,278,730 B2 | 10/2012 | Wahl et al. | |
| 8,362,481 B2 | 1/2013 | Sellathamby et al. | |
| 8,378,776 B1 | 2/2013 | Gabrys et al. | |
| 8,519,506 B2 | 8/2013 | Hopper et al. | |
| 8,643,138 B2 | 2/2014 | Dong | |
| 8,659,149 B2 | 2/2014 | French et al. | |
| 8,674,486 B2 | 3/2014 | Haigh et al. | |
| 8,963,622 B2* | 2/2015 | Lee et al. | 327/530 |
| 2005/0271147 A1 | 12/2005 | Dupuis | |
| 2008/0277761 A1 | 11/2008 | Mahalingam et al. | |
| 2009/0296310 A1 | 12/2009 | Chikara | |
| 2011/0269295 A1 | 11/2011 | Hopper et al. | |
| 2012/0002377 A1 | 1/2012 | French et al. | |
| 2013/0154071 A1 | 6/2013 | Haigh et al. | |
| 2014/0183698 A1 | 7/2014 | Hsu et al. | |
| 2014/0346887 A1 | 11/2014 | Bhamidipati et al. | |
| 2015/0200162 A1* | 7/2015 | Constantino et al. | 438/107 |

\* cited by examiner

*Primary Examiner* — Robert Pascal
*Assistant Examiner* — Kimberly Glenn
(74) *Attorney, Agent, or Firm* — The Mueller Law Office, P.C.

(57) ABSTRACT

An isolator assembly is disclosed. The assembly comprises a laminate consisting essentially of a block of homogenous material and a set of electrical contacts. A first die is coupled to a surface of the laminate. An isolation barrier is located entirely above the surface of the laminate. A second die is coupled to the laminate. The second die is galvanically isolated from the first die by the isolation barrier. The second die is in operative communication with the first die via the isolation barrier and a conductive trace on the laminate. The first die, the second die, the laminate, and the isolation barrier are all contained within an assembly package.

17 Claims, 9 Drawing Sheets

100

800

SINGLE-LAMINATE GALVANIC ISOLATOR ASSEMBLIES

BACKGROUND OF THE INVENTION

In specific circumstances electronic devices need to be galvanically isolated from one another while still being in operative communication. For example, devices that need to be communicatively coupled to exchange information while at the same time operating in different power regimes may need to be isolated so that the lower power device is not damaged by exposure to current levels that it cannot withstand. As another example, a peripheral device operating with a power supply having a first ground level, such as the negative terminal of a battery, may need to communicate with a host device operating with a separate ground level, such as the ground terminal of a mains wall socket. In these circumstances, isolation is required to prevent current flowing from one "ground" to the other when the devices are coupled together. As another example, isolation can protect a device from being adversely affected by fault conditions in a separate device. In all of these circumstances, the devices may be galvanically isolated while still being in communication via electrical, optical, mechanical, or acoustic means.

One of the main considerations that must be taken into account when designing an isolator is the ability of the isolator to withstand large power levels while maintaining a desired degree of isolation. Traditional isolators have therefore utilized a split paddle assembly process in which each side of the isolator is supported by an entirely separate substrate. The two separate substrates are in turn bound together through a packaging process to an overall lead frame that will generally also support contacts to the overall circuit. The isolation device itself is formed between the separate paddles and provides a communication channel between the two while maintaining their galvanic isolation.

FIG. 1 illustrates another approach to enhance the power hold-off capability of an isolator which is to form the isolation devices themselves in the substrate to which the isolated devices are connected. FIG. 1 illustrates isolator assembly 100 that comprises substrate 101 in which two capacitors 102 have been formed via a dielectric layer 103 and conductive traces 104. Separate isolated devices 105 can be connected to the conductive traces at locations 106 and 107 and are thereby isolated via the two capacitors 102. Since the isolation device is formed in the substrate and the breakdown voltage of dielectric 103 is much larger than air, the hold-off voltage capability of the isolator is commensurately increased. Separate devices 105 can include transceiver circuits for encoding signals to be sent through the capacitors 102 and can connect to external isolated circuits via conductive traces 108.

SUMMARY OF INVENTION

In one embodiment, an isolator assembly is provided. The embodiment comprises a laminate consisting essentially of a block of homogenous material and a set of electrical contacts. The embodiment also comprises a first die coupled to a surface of the laminate. The embodiment also comprises an isolation barrier located entirely above the surface of the laminate. The embodiment also comprises a second die coupled to the laminate. The second die is galvanically isolated from the first die by the isolation barrier. The second die is in operative communication with the first die via the isolation barrier and a conductive trace on the laminate. The first die, the second die, the laminate, and the isolation barrier are all contained within an assembly package.

In another embodiment, an apparatus is provided. The embodiment comprises a laminate. The embodiment also comprises a first die connected to a first conductive trace on the laminate via a terminal of the first die. The embodiment also comprises a second die connected to a second conductive trace on the laminate via a terminal of the second die. The embodiment also comprises an isolation barrier comprising a discrete capacitor connected to the first conductive trace and the second conductive trace, and entirely located above the laminate. The first die is galvanically isolated from the second die by the isolation barrier. The isolation barrier, the first conductive trace, and the second conductive trace form a signal transmission pathway from the first die to the second die.

In another embodiment, a packaged isolator assembly is provided. The embodiment comprises a laminate. The embodiment also comprises a first packaged integrated circuit bonded to the laminate. The embodiment also comprises a second packaged integrated circuit bonded to the laminate. The embodiment also comprises a discrete surface mount capacitor bonded to the laminate. The embodiment also comprises a set of conductive traces formed on the laminate. The conductive traces and the discrete surface mount capacitor form a communication channel between the first packaged integrated circuit and the second packaged integrated circuit. The discrete surface mount capacitor galvanically isolates the first packaged integrated circuit from the second packaged integrated circuit.

DETAILED DESCRIPTION OF THE EMBODIMENTS

Figure 1:
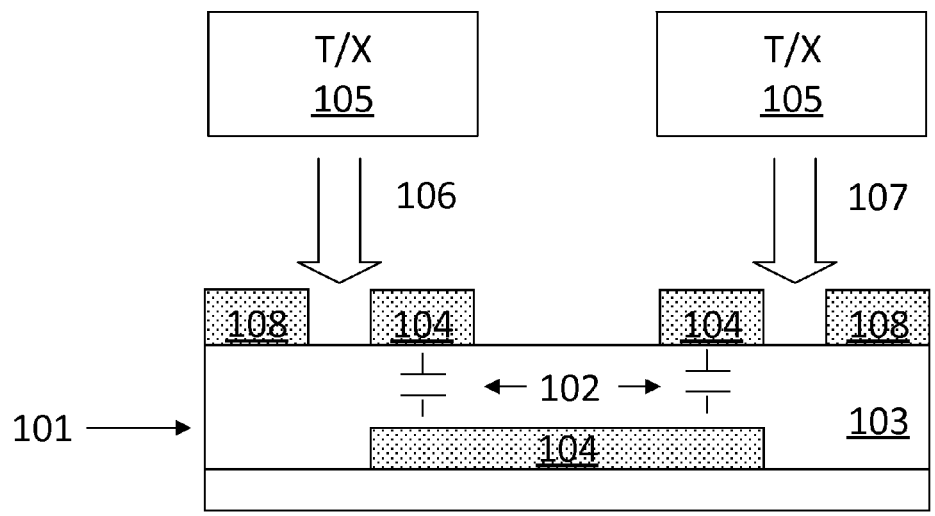
FIG. 1 illustrates a cross section of an isolator assembly that is in accordance with the related art.

Reference now will be made in detail to embodiments of the disclosed invention, one or more examples of which are illustrated in the accompanying drawings. Each example is provided by way of explanation of the present technology, not as a limitation of the present technology. In fact, it will be apparent to those skilled in the art that modifications and variations can be made in the present technology without departing from the spirit and scope thereof. For instance, features illustrated or described as part of one embodiment may be used with another embodiment to yield a still further embodiment. Thus, it is intended that the present subject matter covers all such modifications and variations within the scope of the appended claims and their equivalents.

Various multi-die isolator assemblies formed on a single laminate can be described with reference to FIGS. 2-7. Methods of manufacturing those assemblies can be described with reference to FIGS. 8 and 9. The isolator assemblies can be used to transmit galvanically isolated data or power signals. For example, the isolator assemblies could serve as isolators for one or more channels used to transmit information in accordance with the universal serial bus (USB) standard. Galvanic isolation can be provided by an isolation barrier comprising an isolation device that is also connected to the laminate. The multiple dies of the multi-die isolator assembly can be isolated by the isolation device and can contain transceivers for communicating across the isolation barrier. The transceivers could be repeaters or redrivers that accept signals from an external source and prepare them for transmission across the isolation barrier, or that accept signals from the isolation barrier and prepare them for transmission out of the isolator assembly. The isolator assemblies can provide isolation functionality to external systems that are coupled independently to different dies in the multi-die assembly on either side of the isolation barrier. The external systems can be coupled to the isolators via conductive terminals on the multi-die package such as pins, leads, or solder bumps on a package containing the assembly.

The laminates to which the multiple dies of the multi-die isolator assemblies are coupled can be blocks of homogenous material. For example, the laminate may be a block of non-conductive material with multiple layers of conductive traces formed on its surface, an interposer, an etched wiring board, or a miniature printed circuit board (mini-PCB). The laminate can also include electrical contacts for connecting with systems that are external to the isolator assembly, such as the systems for which the assembly is providing isolation. The approaches described below allow for the use of a single laminate with multiple dies while still providing a high degree of galvanic isolation, and thereby also provide the overall assembly with a given degree of stability in a less expensive and complex manner than approaches that utilize a split paddle assembly.

The assemblies can include multiple isolated channels and multiple isolation barriers. The channels can each be bidirectional or unidirectional. Depending upon the complexity of the signals that the assembly was meant to handle, and the encoding scheme selected for transmitting the signal across the isolation barrier that was selected, different numbers of channels may be required. For example, to comply with the USB 3.0 four unidirectional isolation barriers comprising two channels may be required, while an entirely separate channel may be required if the same isolation device was meant to be backwards compatible with the USB 2.0 standard.

Isolators need to provide galvanic isolation to the devices they are isolating and also rapidly transmit information between the devices. Ideally, the isolator would not introduce any latency or delay to the isolated signals. In the interest of reducing delay, the isolated devices should be placed in close proximity to the isolation devices to minimize transit time for the signals that are being sent between the isolated devices. However, minimizing the distance between two isolated devices can increase the likelihood of breakdown between the terminals of the isolated devices. As described with reference to FIG. 1, one solution to the conflicting effects of proximity between conductive isolated components of an isolator assembly is to form the isolation devices in the substrate. However, approaches that are in keeping with that technique require the production of custom substrates via manufacturing processes that are generally used for monolithic integrated circuit construction, or system-level processes involving the bonding of complex heterogeneous substrates. Neither of these families of solutions are appealing as they are both expensive and technically complex to varying degrees. It is therefore beneficial to utilize approaches in which the isolation barrier is located entirely above the surface of the laminate.

Different packaging techniques for the isolator assemblies are described below with reference to FIGS. 3-5 and 9. These techniques include the use of conformal coatings, dielectric encapsulants, injection molding, and other methods for forming protective layers to a system level design on a single laminate. These approaches also allow for the placement of the isolated devices in close proximity because the protective layers have a greater breakdown voltage than air, lie in between and isolate conductive portions of the isolated devices from each other, and serve to increase the hold-off capabilities of the isolator assembly.

The use of basic laminates allows for greater flexibility in terms of the additional components that can be added to the overall isolator assembly. The assemblies can include additional passive devices and or other dies formed on the same laminate. The additional dies can provide timing, configuration control, process trimming, or general logic functionality to the overall assembly. They can also include linear regulators for power conditioning. The additional dies can also be connected in series between the aforementioned external systems and the isolation devices such that some of them are in communication via the isolation devices, but are also galvanically isolated by isolation devices. These additional dies can also include passive devices that house the actual isolation devices such as capacitors or inductors, or passives that are used for other purposes such as supply decoupling capacitors.

Figure 2A:
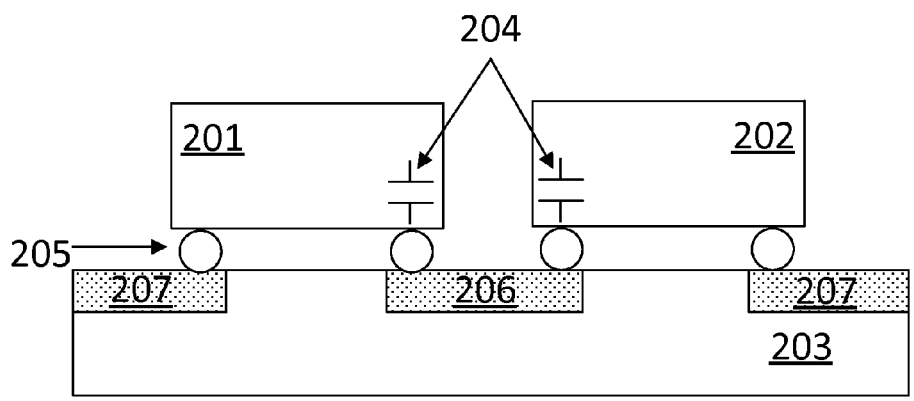
FIGS. 2A and 2B illustrate cross sections of two isolator assemblies that are each in accordance with embodiments of the present invention.
Figure 2B:
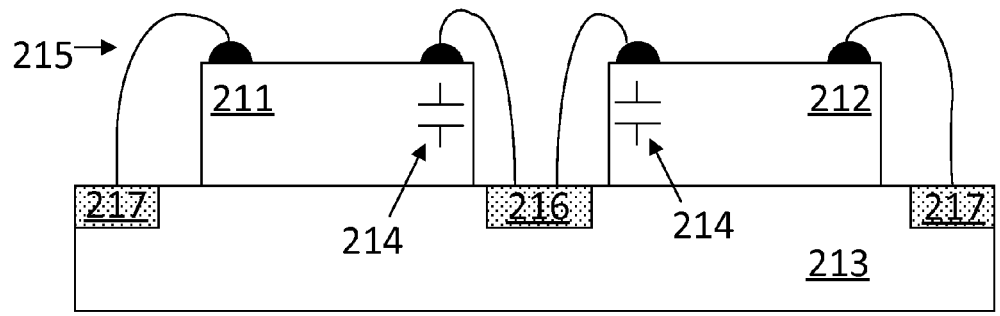

FIGS. 2A and 2B illustrates cross sections 200 and 210 of two isolator assemblies. The illustrated assemblies provide some of the benefits identified above regarding the potential proximity of isolated devices on a single laminate. Cross section 200 includes multiple dies 201 and 202 coupled to laminate 203. Cross section 210 includes multiple dies 211 and 212 coupled to laminate 213. Both of the assemblies illustrated by cross sections 200 and 210 include isolation devices 204 and 214 formed in the isolated dies. Note that although FIG. 2A and FIG. 2B show an isolation device in each die, the isolation barrier may lie completely within a single die. Regardless, multiple dies 201 and 202 are galvanically isolated from each other by the isolation barrier, while at the same time, the multiple dies 201 and 202 are in operative communication with each other via the isolation barrier and conductive traces 206 and 216 on their laminates. The benefit of this approach is that the isolation devices are insulated via the packaging of the die such that the isolator assembly has a larger breakdown voltage. Furthermore, this approach can be used with basic laminates that do not include passives formed in the laminate itself. Therefore, this approach provides the benefit of higher isolation hold-off without requiring complex and expensive substrates.

The isolation devices formed in the isolated dies can be any type of isolator capable of being packaged with an integrated circuit. As illustrated, isolation devices 204 and 214 are capacitors. However, the isolation devices could also be photocouplers, transformers, or any other inductive circuitry. In situations where the isolation devices are capacitors, the capacitors can be built into the dies using on-chip oxide dielectric layers, redistribution layers (RDL) formed during a back-end-of-line process, or a combination thereof. For example, the capacitors could be metal-insulator-metal (MIM) capacitors formed in or above the wiring layers in an integrated circuit formed in the die. The capacitors could also be formed partially in the die and partially on the surface of the laminate. For example, a plate of the capacitor could be formed in the wiring or redistribution layers of the die, while a second plate was formed by a conductive trace on the laminate. If the die were flip chip bonded to the laminate, the capacitor could effectively comprise one of the electrical contacts between the die and the laminate. In other words, the capacitor could replace a solder bump or other contact that would otherwise have connected the die to the laminate.

The multiple dies that comprise the isolator can be coupled to the laminate using various techniques. For example, dies 201 and 202 are flip chip connected to conductive traces 206 and 207 formed on the surface of laminate 203, while dies 211 and 212 are connected to conductive traces 216 and 217 formed on the surface of laminate 213 via wire bonds. In either case, the conductive traces can be conductive lines deposited on the surface of the laminate, or deposited in etched regions of the laminate. The conductive lines can be metal such as copper or tungsten. As illustrated in FIG. 2A and FIG. 2B, dies 201 and 202 are connected to the laminate via a flip chip package and solder bumps 205 connected to a top side contact on the die, while dies 211 and 212 are connected to the laminate via wire bonds 215. Flip chip connections provide a benefit in that the connection between the internal circuitry of the die and the conductive trace is physically shorter which allows for a faster transmission of signals across the isolation barrier. Wire bond connections provide a benefit in that, when the isolation devices utilize inductors, the wire bonds themselves can serve as part of the isolation device through their own inherent impedance. Notably, although the assemblies in cross sections 200 and 210 are illustrated as being limited to a single connection type, in certain approaches a subset of the multiple dies on the laminate will be flip chip connected while the rest are connected using wire bonds.

Figure 3A:
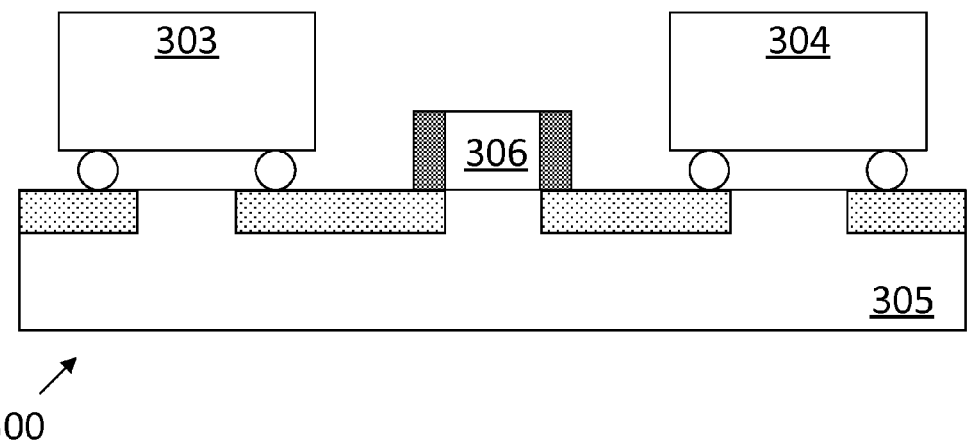
FIGS. 3A and 3B illustrate cross sections of isolator assemblies, utilizing a discrete isolation device, that are each in accordance with embodiments of the present invention.
Figure 3B:
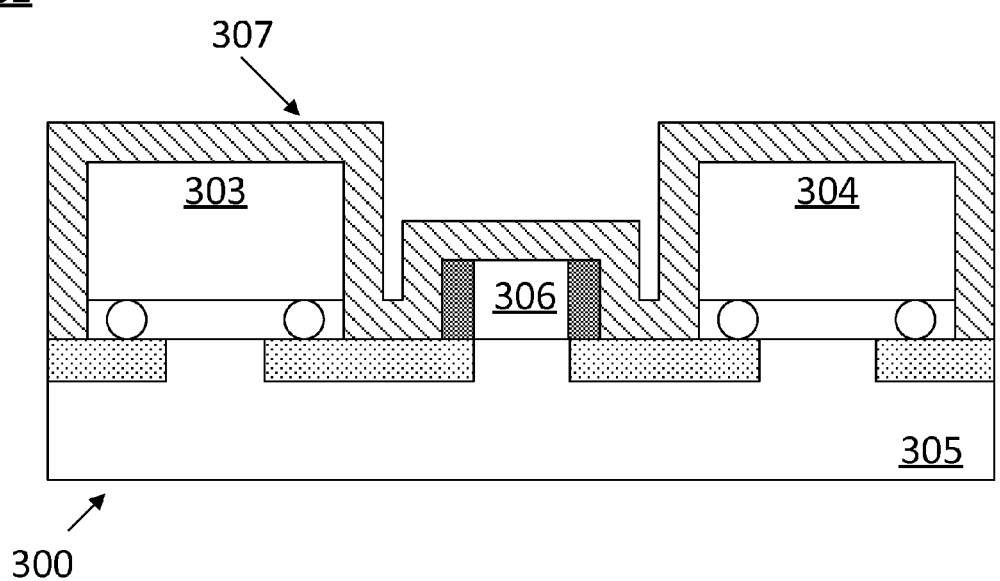

FIGS. 3A and 3B illustrate cross sections 301 and 302 of an isolator assembly 300 at two stages of a manufacturing process. Isolator assembly 300 includes multiple dies 303 and 304 that are flip chip connected to laminate 305. The isolator assembly also includes an isolation device formed above the surface of the laminate in the form of discrete surface mount capacitor 306. With all else equal, the use of a discrete device makes isolator assembly 300 a less expensive option than the type of isolator assembly discussed with reference to FIG. 2A and FIG. 2B because discrete isolation devices can be pulled off the shelf for use in any design as opposed to being custom made for a particular purpose. Furthermore, the use of a discrete device provides certain benefits with respect to the type of isolator assembly discussed with reference to FIG. 1 because forming the isolation device above the substrate removes the need to etch into the substrate or conduct other processes to manufacture an exotic substrate with the goal of creating an isolation device in the substrate itself.

Although in-laminate isolation devices, such as through hole capacitors, and other passives formed in the laminate, can be utilized in accordance with the approaches described herein, such approaches cannot be utilized with thin laminates. Thin laminates are important because they limit the amount of packaging material required to package the assembly. Also, thin laminates by definition have less material and are therefore less expensive than thicker laminates. In general, component selection that limits the width of the package provides benefits in this regard such that the use of thin capacitors such as surface-mount capacitors, and other thin discrete devices can beneficially be utilized in accordance with the approaches described herein.

The approaches described with reference to cross sections 200, 210, and 301 can provide adequate isolation and do not need further processing. The devices can be left exposed to ambient air, or they can be packaged in a manner that leaves the devices exposed to air pockets within the package. However, the voltage withstand capability of the isolator assembly is determined by the minimum air gap exposed to the high voltage difference across the isolator. The breakdown resistance of air being typically 1 kV/mm in dry air. As such, the use of a discrete device above the surface of the laminate as in cross section 301, and the exposure of conductive leads to open air as in cross sections 200 and 210, can create a deleteriously weak breakdown path through the air above the laminate. This issue can be solved by further processing steps that introduce a system-level package to cut off the weak breakdown path. One such approach is the formation of a vacuum pocket in the package or a high pressure region through the introduction of an inert gas such as argon, but these packaging approaches can be expensive. Additional packaging approaches described below serve to address this design consideration, allow isolated devices to be placed in closer proximity, and allow for the use of discrete isolation devices above the laminate surface.

One packaging approach that can enhance the breakdown resistance of an isolator assembly is the introduction of a conformal coating over the isolated devices. Cross section 302 includes a conformal coating 307 that can be formed on the isolator assembly after the isolation barrier is formed and the die are attached to the laminate. The conformal coating can be any material with a high breakdown voltage that can be made to, at least temporarily, conform to a surface to which it is applied. Potential materials include: a plastic spray, acrylic, epoxy, polyurethane silicones, parylene, or an amorphous fluoropolymer. As a result, the conformal coating 307 covers the first and second dies 303 and 304 and also covers the discrete capacitor 306. The conformal coating beneficially has a high dielectric coefficient and serves to isolate conductive terminals of the assembly from each other to prevent shorts and catastrophic breakdowns of the system. This conformal coating is an example of methods that allow for the usage of discrete devices and placement of the dies in close proximity, while maintaining a desired level of breakdown resistance.

Although isolator assembly 300 was discussed with reference to an isolation device that comprised a capacitor, the assembly could alternatively utilize any of the isolation devices described above including photocouplers, transformers, and other inductive devices. Using the approach described with reference to cross section 302 would allow for the usage of discrete isolation devices of any kind as long as they were capable of being covered by a conformal coating. This limitation would effectively cover any open market discrete device that is sold for use with a PCB or other system-level laminate. However, low profile devices such as inductors formed by conductive lines on the laminate, or thin surface mount capacitors, would be most conducive to this approach because the thickness of the conformal coating can be a limiting factor in terms of processing time and cost of the overall assembly.

Figure 4:
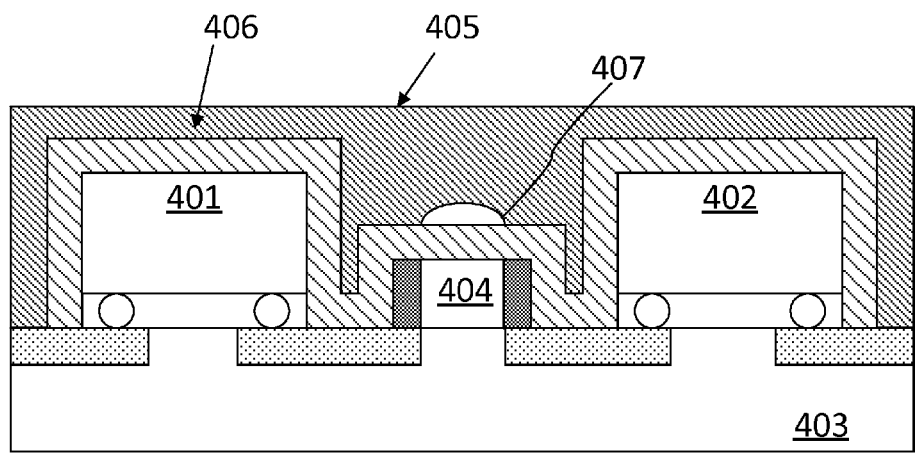
FIG. 4 illustrates a cross section of an isolator assembly, utilizing a conformal coating and encapsulant, which is in accordance with embodiments of the present invention.

One packaging approach that can enhance the breakdown resistance of an isolator assembly is the introduction of an encapsulant over the multiple dies and isolation devices on the surface of the laminate. The encapsulant can form an exterior surface for a package of the isolator assembly. The assembly can also include an exterior surface comprising the back side of the laminate, or the encapsulant can cover both sides of the assembly. FIG. 4 illustrates an isolator assembly cross section 400 comprising a first die 401 and a second die 402 formed on a laminate 403 along with a discrete surface mount capacitor 404. Also illustrated is an encapsulant 405 formed over the first die, the second die, and the isolation barrier. The encapsulant is a dielectric encapsulant such as: a plastic encapsulant, a resin, an expoxy, a silicon encapsulant, or a polyimide.

The encapsulant may be place directly on the substrate and the isolated devices. However, as illustrated, encapsulant 405 has been deposited on top of conformal coating 406 which was formed prior to the formation of encapsulant 405. The materials used to form encapsulant 405 is generally less expensive than the material used to form conformal coating 406 and can provide a greater degree of stability and protection from external forces at the same price point as an equal amount of conformal coating 406. Indeed, certain materials used for conformal coating 406 cannot be used as the external packaging for the device because they do not adequately adhere to the assembly for use as a permanent encapsulant. At the same time, specific materials used to form encapsulant 405, such as a plastic encapsulant, can create voids or include conductive particles that can compromise the breakdown strength of the isolator. As such, in some approaches it is beneficial to form a conformal coating 406 over the device and then form an encapsulant 405 over the conformal coating. The combination of a conformal coating and dielectric encapsulant would allow the isolator devices and isolated devices to be placed in close proximity. For example, a conformal coating and dielectric encapsulant would allow a terminal of the first die 401 to be placed within 1.25 millimeters of an alternative terminal of the discrete capacitor 404 while still maintaining a greater than 1 kV hold off capability.

Although the approaches discussed with reference to FIG. 4 included the use of a discrete capacitor as the isolation device of the isolator assembly, the approaches are not so limited. The use of a conformal coating and/or an encapsulant can also beneficially be applied to approaches in which the isolation devices are formed wholly or partially in the dies themselves, as well as to approaches using any of the isolation devices described above. Indeed, regardless of whether or not a discrete device is used, the breakdown voltage of the isolator assembly will likely still be enhanced through the introduction of a conformal coating having a higher breakdown strength than air.

Another packaging approach that can enhance the breakdown voltage of the isolator assembly is to introduce a space-filing dielectric material across the entire assembly to encapsulate the whole package. An example of this approach would be the introduction of a plastic injection moulding across the entire assembly. This approach would be more expensive than the other packaging approaches described above, but it would be useful in situations where a conformal coating or less expensive encapsulant was not an option. In addition, since an injection moulding provides complete coverage of all exposed components of either side of the isolation barrier, an injection moulding would allow the isolation devices and dies to be placed in close proximity. For example, an injection moulding would allow a terminal of the first die to be placed within 1 millimeter of an alternative terminal of the discrete capacitor while still maintaining a greater than 1 kV hold off capability.

An example of an isolator assembly packaged using an injection moulding can be described with reference to FIG. 5.

Figure 5:
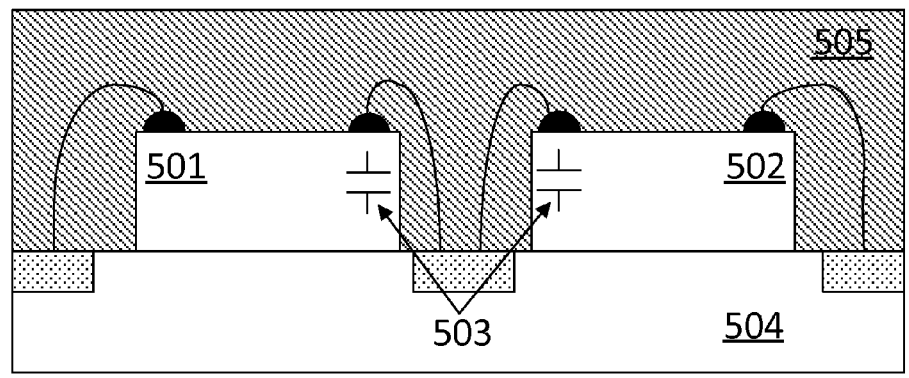
FIG. 5 illustrates a cross section of an isolator assembly, utilizing an injection moulding, which is in accordance with embodiments of the present invention.

Cross section 500 in FIG. 5 includes a first die 501, a second die 502, and one or more isolation devices 503, all located above the surface of substrate 504. Cross section 500 is similar to cross section 210 in that communication through the isolator is achieved through the use of wire bonds coupling the dies to conductive traces on the laminate. However, instead of being exposed to ambient air, the isolator assembly in cross section 500 is covered by injection moulding 505. This combination of bonding type and packaging method is appropriate in that it may be difficult for a conformal coating to adhere to the bond wires connecting the dies to the laminate. However, a space-filing dielectric material would be able to isolate the bond wires and would additionally provide added stability and isolation to the isolator assembly as a whole.

Figure 6A:
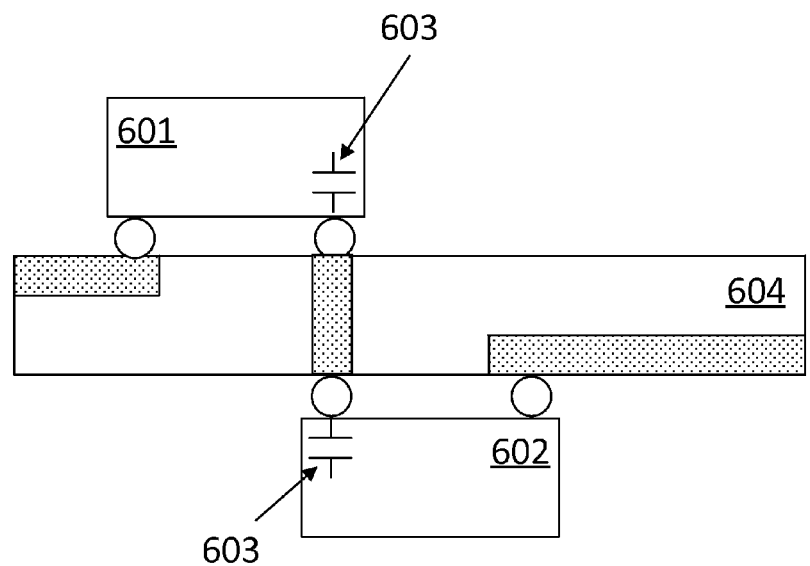
FIGS. 6A and 6B illustrate cross sections of two isolator assemblies, with dies attached to either side of a laminate, which are each in accordance with embodiments of the invention.
Figure 6B:
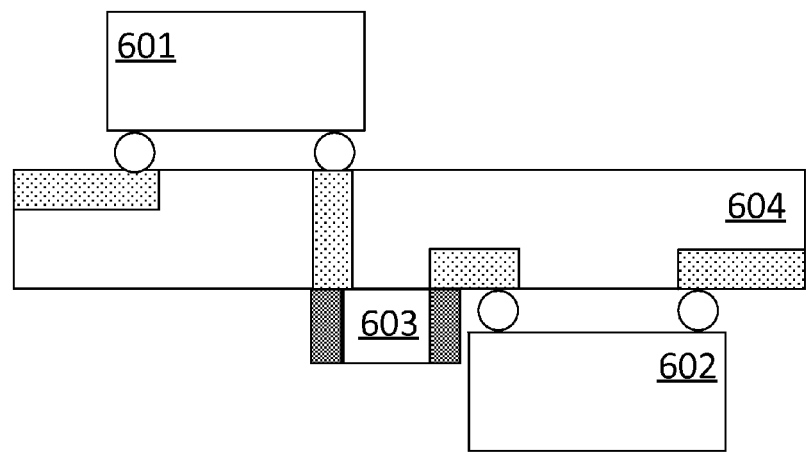

FIG. 6 illustrates two cross sections 600 and 610 of isolator assemblies each comprising a first die 601, a second die 602, and isolation devices 603 all coupled to a laminate 604. As illustrated, the isolation devices 603 are again each formed over a surface of laminate 604 such that a basic laminate can be used and the laminate can also be a thin laminate. However, the dies in both cross sections are formed on different surfaces of laminate 604. As drawn, the isolation devices are formed in dies in cross section 600 and on the laminate in cross section 610. Regardless of where the isolation devices is located, placing the dies on either side of the laminate helps to increase the breakdown voltage of the isolator assembly because there is a total lack of open air pathways between either side of the isolation barriers. Indeed, the laminate will generally extend out of the page and to the left and right to a much greater degree than illustrated, such that a breakdown path that lapped around the edge of the laminate would effectively have a negligible impact on the performance of the device. Although these cross sections are drawn using capacitive isolators, any of the isolation devices discussed above could be used instead.

Figure 7:
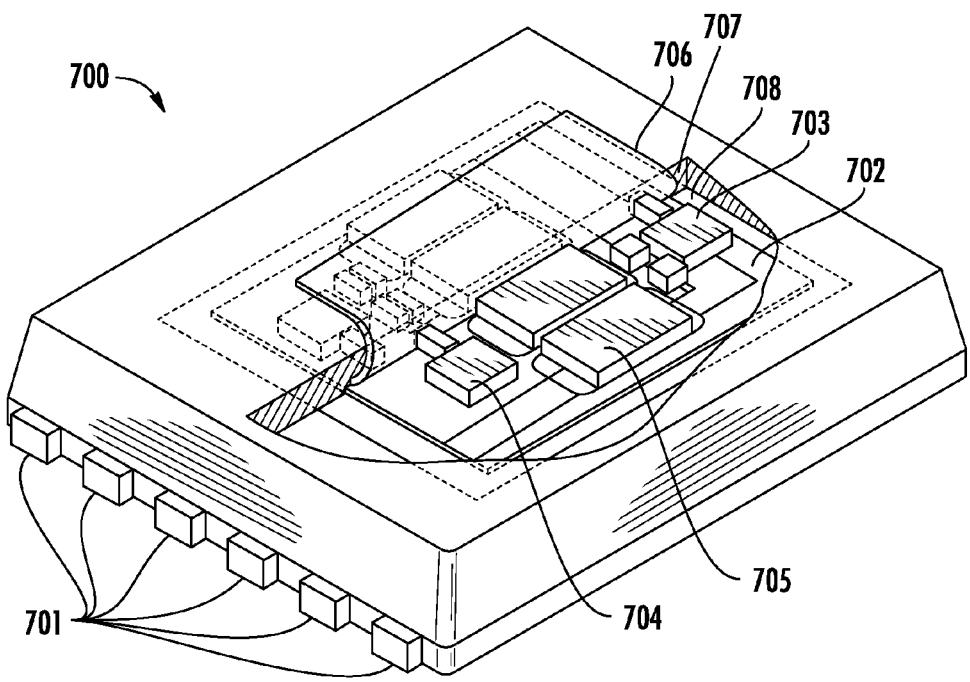
FIG. 7 is an illustration of a packaged isolator assembly that is in accordance with embodiments of the invention.
Figure 7:
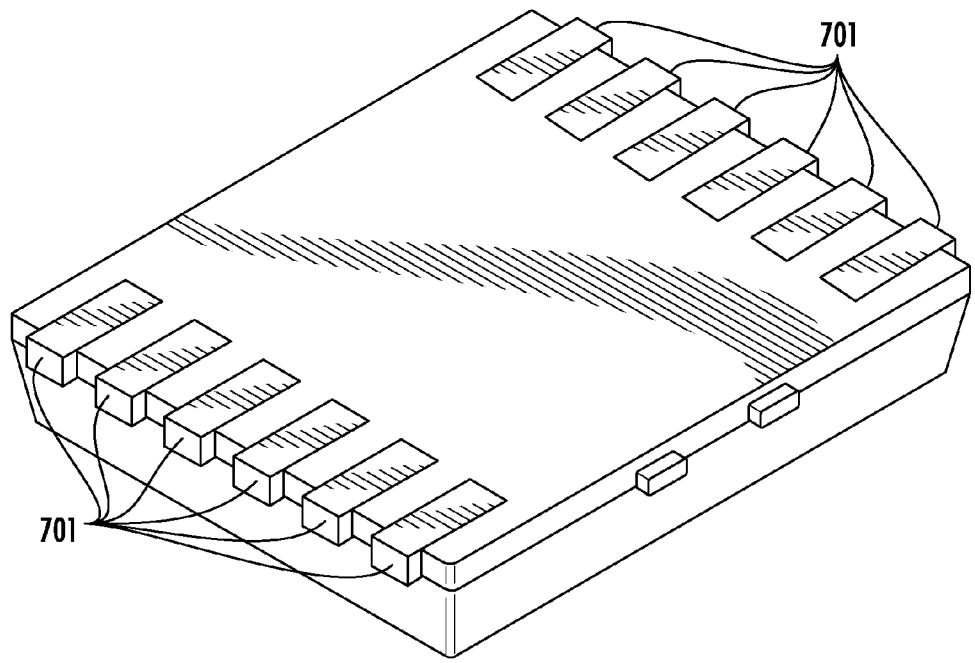

FIG. 7 illustrates a packaged isolator assembly 700 from both the front side and the back. In this case, the assembly has been placed in a DFN package with 6 metal contacts 701 in the package for each side of the isolator. The assembly is formed on a mini-PCB 702 and includes a first die 703 and a second die 704 that are isolated by discrete surface mount capacitor 705. All of the aforesaid components are covered by a conformal coating 706 and a plastic encapsulant 707 which have been removed in the drawing to expose the first die 703, the discrete surface mount capacitor 705, and the second die 704. Conductive traces between the dies and the capacitor are shown in the exposed portions of the mini-PCB as well as by phantom lines under the encapsulant. Note that the package contains another surface mount capacitor between first die 703 and second die 704 that is not shown in phantom because the package has not been removed from above it. Also note that the package includes an entirely separate isolation channel 708 that is similar to the channel that uses first die 703 and second die 704. In the illustrated approach, the isolator is compatible with the USB 3.0 standard and each of the illustrated channels is unidirectional to enable bidirectional communication through the isolator. The assembly could be modified to be backwards compatible with USB 2.0 through the addition of additional devices and contacts.

Figure 8:
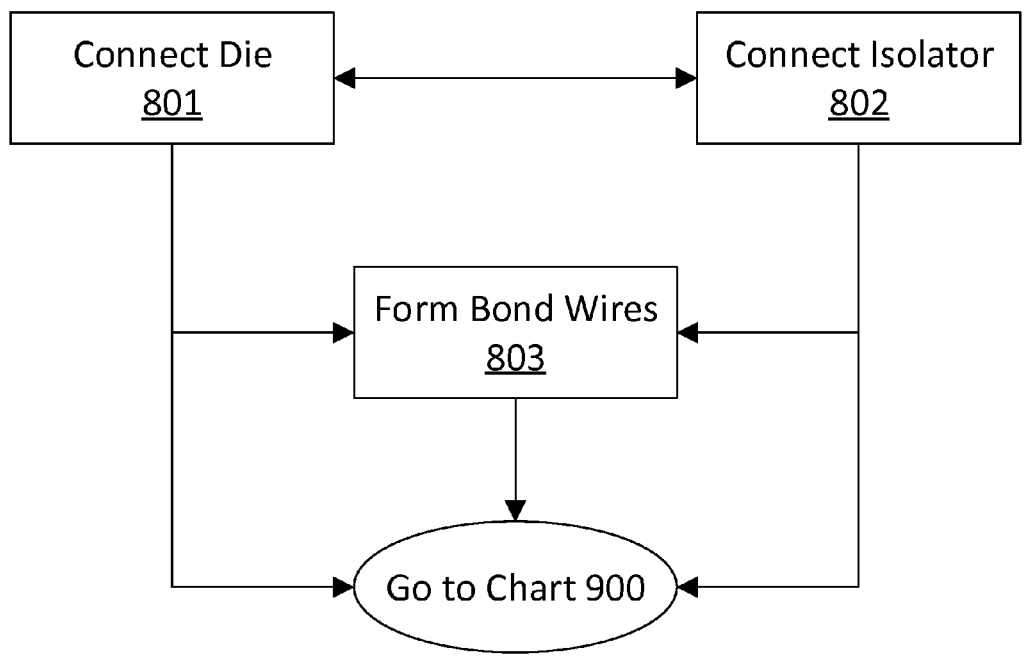
FIG. 8 illustrates a flow chart of methods for forming the isolator assemblies disclosed with reference to FIGS. 2-7.

FIG. 8 illustrates a flow chart 800 of methods that can be used to form the isolator assemblies described above. Flow chart 800 begins with step 801 in which a first die and a second die are bonded to a single laminate. This bonding process can be conducted using flip chip bonding, wire bonding, or any other approach that will ultimately provide an electrical connection between the terminals of both the dies and the isolation barrier as well as providing a physical connection between the dies and the laminate to assure that the dies stay in place for the remainder of the manufacturing process. Flow chart can alternatively continue with, or begin with, step 802 in which an isolation devices is bonded to the laminate. In approaches that utilize this step, the isolation device is a discrete device that is separate from the die. In these approaches steps 801 and 802 can be conducted in either order. In other approaches in which the isolation devices are formed in the dies, step 802 can be skipped entirely.

Flow chart 800 continues with step 803 in which bond wires are optionally formed. The bond wires can connect terminals on the dies to conductive traces on the laminate. Alternatively, the bond wires can connect terminals on the dies to terminals on a discrete isolation devices. In a final alternative, the bond wires can serve as inductors and thereby act as isolation devices themselves. In approaches in which the dies are flip chip connected to the substrate, this step could be reserved for connecting terminals of a discrete isolation device to conductive traces on the laminate, or the step could be skipped entirely if the isolation devices also did not need wire bonding.

Figure 9:
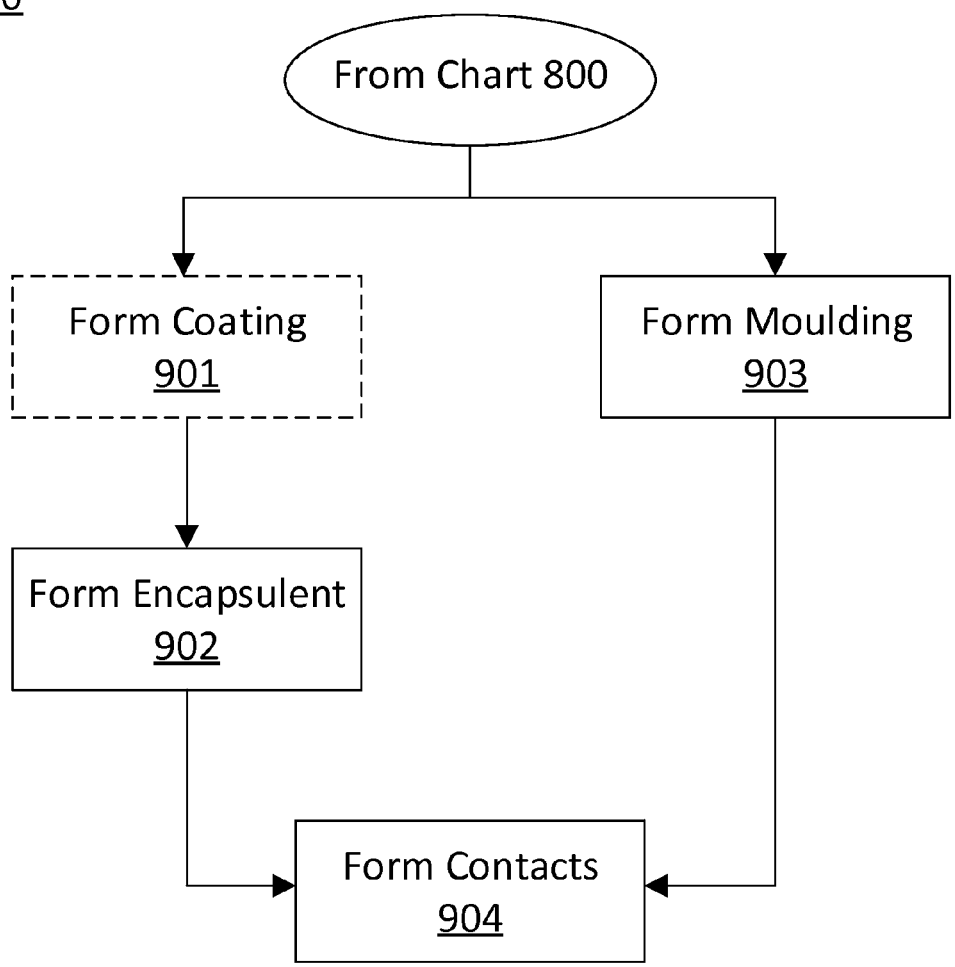
FIG. 9 illustrates a flow chart of methods for packaging the isolator assemblies disclosed with reference to FIGS. 2-7.

FIG. 9 illustrates a flow chart 900 of methods for packaging the isolator assemblies disclosed above. Flow chart 900 begins with an optional step 901 in which a conformal coating such as a plastic spray or sputter deposited dielectric is formed over the dies and isolation device formed on the substrate. Flow chart 900 then continues with step 902 in which an encapsulant is formed over the dies and isolation device. The encapsulant can be a plastic encapsulant that serves as the exterior surface of the overall package for the isolator assembly.

Flow chart 900 can optionally begin with step 903 in which a moulding is formed over the isolator assembly. The moulding can be an injected dielectric material that expands after injection to completely isolated all exposed portions of the isolator assembly. An additional packaging material can be applied to the injection moulding to form an outer shell for the package such as a metal or ceramic package, or the injected material itself can serve as the exterior surface of the package.

Flow chart 900 terminates with step 904 in which external contacts are formed to the isolator assembly. The contacts can be solder bumps, copper or gold leads extending from a lead frame, an array of pads for wire bond contacts, or any other external contact capable of allowing the isolator assembly to communicate with external systems. In situations in which the dies coupled directly to the isolation barrier are particularly complex, or in situations where the laminate includes additional dies with encoding functionality, the external contacts can be more complex such as a USB terminal or other bus interface.

While the specification has been described in detail with respect to specific embodiments of the invention, it will be appreciated that those skilled in the art, upon attaining an understanding of the foregoing, may readily conceive of alterations to, variations of, and equivalents to these embodiments. These and other modifications and variations to the present invention may be practiced by those skilled in the art, without departing from the spirit and scope of the present invention, which is more particularly set forth in the appended claims.

What is claimed is:

1. An isolator assembly comprising:
a laminate consisting essentially of a block of homogenous material and a set of electrical contacts;
a first die coupled to a surface of the laminate;
an isolation barrier located entirely above the surface of the laminate;
a second die coupled to the laminate, wherein the second die is galvanically isolated from the first die by the isolation barrier, and wherein the second die is in operative communication with the first die via the isolation barrier and a conductive trace on the laminate;
a discrete capacitor that is coupled to the laminate via a first terminal and a second terminal; and
a dielectric encapsulant that isolates the first die from the discrete capacitor;
wherein the first die, the second die, the laminate, and the isolation barrier are all contained within an assembly package;
wherein the isolation barrier comprises the discrete capacitor; and
wherein the dielectric encapsulant forms an exterior surface for a package for the isolator assembly.

2. The isolator assembly of claim 1, further comprising:
a conformal coating that covers the first die, the second die, and the discrete capacitor;
wherein the conformal coating and the dielectric encapsulant isolates the first die from the discrete capacitor; and
wherein the dielectric encapsulant covers the conformal coating.

3. An isolator assembly comprising:
a laminate consisting essentially of a block of homogenous material and a set of electrical contacts;
a first die coupled to a surface of the laminate;
an isolation barrier located entirely above the surface of the laminate; and
a second die coupled to the laminate, wherein the second die is galvanically isolated from the first die by the isolation barrier, and wherein the second die is in operative communication with the first die via the isolation barrier and a conductive trace on the laminate;
wherein the first die, the second die, the laminate, and the isolation barrier are all contained within an assembly package;
wherein the first die is a flip chip die; and
wherein the first die is coupled to the laminate via a top side contact of the first die.

4. The isolator assembly of claim 3, further comprising:
a discrete surface mount capacitor that is coupled to the laminate via a first terminal and a second terminal; and
a dielectric encapsulant that isolates the first die from the discrete surface mount capacitor;
wherein the isolator barrier comprises the discrete surface mount capacitor;
wherein the laminate is a printed circuit board; and
wherein the second die is in operative communication with the first die via pulses sent across the discrete surface mount capacitor.

5. An isolator assembly comprising:
a laminate consisting essentially of a block of homogenous material and a set of electrical contacts;
a first die coupled to a surface of the laminate;
an isolation barrier located entirely above the surface of the laminate;
a second die coupled to the laminate, wherein the second die is galvanically isolated from the first die by the isolation barrier, and wherein the second die is in operative communication with the first die via the isolation barrier and a conductive trace on the laminate; and
a capacitor having a first plate and a second plate;

wherein the first die, the second die, the laminate, and the isolation barrier are all contained within an assembly package;
wherein the first plate is formed in the first die; and
wherein the isolator barrier comprises the capacitor.

6. The isolator assembly of claim 5, further comprising:
a dielectric encapsulant that isolates the first die from the second die; and
a conformal coating that covers the first die and the second die;
wherein the conformal coating and the dielectric encapsulant isolate the first die from the second die; and
wherein the dielectric encapsulant covers the conformal coating.

7. The isolator assembly of claim 5, wherein:
the second plate is formed on the laminate;
the first die is a flip chip die; and
the first die is coupled to the laminate via a top side contact of the first die.

8. An apparatus comprising:
a laminate;
a first die connected to a first conductive trace on the laminate via a terminal of the first die;
a second die connected to a second conductive trace on the laminate via a terminal of the second die;
an isolation barrier comprising a discrete capacitor connected to the first conductive trace and the second conductive trace, and entirely located above the laminate; and
an encapsulant that isolates the first die from the discrete capacitor;
wherein the first die is galvanically isolated from the second die by the isolation barrier;
wherein the isolation barrier, the first conductive trace, and the second conductive trace form a signal transmission pathway from the first die to the second die; and
wherein the encapsulant and the laminate form a package.

9. The apparatus of claim 8, further comprising:
a conformal coating that covers the first die, the second die, and the discrete capacitor;
wherein the conformal coating isolates the first die from the discrete capacitor; and
wherein the encapsulant covers the conformal coating.

10. The apparatus of claim 8, wherein:
the first die is a flip chip die; and
the terminal of the first die is connected to the first conductive trace on the laminate via a solder ball.

11. An apparatus comprising:
a laminate;
a first die connected to a first conductive trace on the laminate via a terminal of the first die;
a second die connected to a second conductive trace on the laminate via a terminal of the second die;
an isolation barrier comprising a discrete capacitor connected to the first conductive trace and the second conductive trace, and entirely located above the laminate; and
a dielectric encapsulant that isolates the first die from the discrete capacitor;
wherein the first die is galvanically isolated from the second die by the isolation barrier;
wherein the isolation barrier, the first conductive trace, and the second conductive trace form a signal transmission pathway from the first die to the second die; and
wherein the discrete capacitor is a discrete surface mount capacitor that is coupled to the laminate via a first terminal and a second terminal.

12. An apparatus comprising:
a laminate;
a first die connected to a first conductive trace on the laminate via a terminal of the first die;
a second die connected to a second conductive trace on the laminate via a terminal of the second die;
an isolation barrier comprising a discrete capacitor connected to the first conductive trace and the second conductive trace, and entirely located above the laminate; and
an injection moulding that isolates the first die from the discrete capacitor;
wherein the first die is galvanically isolated from the second die by the isolation barrier; and
wherein the isolation barrier, the first conductive trace, and the second conductive trace form a signal transmission pathway from the first die to the second die.

13. An apparatus comprising:
a laminate;
a first die connected to a first conductive trace on the laminate via a terminal of the first die;
a second die connected to a second conductive trace on the laminate via a terminal of the second die; and
an isolation barrier comprising a discrete capacitor connected to the first conductive trace and the second conductive trace, and entirely located above the laminate;
wherein the terminal of the first die is within 1 millimeter of an alternative terminal of the discrete capacitor;
wherein the first die is galvanically isolated from the second die by the isolation barrier; and
wherein the isolation barrier, the first conductive trace, and the second conductive trace form a signal transmission pathway from the first die to the second die.

14. The apparatus of claim 13, wherein:
the terminal of the first die is connected to the first conductive trace on the laminate via a wire bond.

15. A packaged isolator assembly comprising:
a laminate;
a first packaged integrated circuit bonded to the laminate;
a second packaged integrated circuit bonded to the laminate;
a discrete surface mount capacitor bonded to the laminate;
a set of conductive traces formed on the laminate; and
an injection moulding that isolates the first packaged integrated circuit from the discrete capacitor and that forms an external surface for the packaged isolator assembly;
wherein the conductive traces and the discrete surface mount capacitor form a communication channel between the first packaged integrated circuit and the second packaged integrated circuit;
wherein the discrete surface mount capacitor galvanically isolates the first packaged integrated circuit from the second packaged integrated circuit;
wherein a terminal of the first packaged integrated circuit is connected to a first conductive trace in the set of conductive traces formed on the laminate via a wire bond; and
wherein the terminal of the first packaged integrated circuit is within 1 millimeter of an alternative terminal of the discrete surface mount capacitor.

16. A packaged isolator assembly comprising:
a laminate;
a first packaged integrated circuit bonded to the laminate;
a second packaged integrated circuit bonded to the laminate;
a discrete surface mount capacitor bonded to the laminate;
a set of conductive traces formed on the laminate; and a dielectric encapsulant that isolates the first packaged integrated circuit from the discrete capacitor;

wherein the conductive traces and the discrete surface mount capacitor form a communication channel between the first packaged integrated circuit and the second packaged integrated circuit;

wherein the discrete surface mount capacitor galvanically isolates the first packaged integrated circuit from the second packaged integrated circuit; and wherein the first packaged integrated circuit is in a flip chip package.

17. The packaged isolator assembly of claim 16, wherein a conformal coating and the dielectric encapsulant isolate the first packaged integrated circuit from the discrete capacitor;

wherein the dielectric encapsulant covers the conformal coating; and wherein the terminal of the first packaged integrated circuit is within 1.25 millimeters of an alternative terminal of the discrete surface mount capacitor.

\* \* \* \* \*